United States Patent
Pfahlert et al.

(10) Patent No.: US 7,148,808 B1
(45) Date of Patent: Dec. 12, 2006

(54) SYSTEM FOR BATTERY ALARM NOTIFICATION AND A METHOD FOR IMPLEMENTING SAME

(75) Inventors: Daniel L. Pfahlert, Fairfield, CA (US); Vinh DePaul, Elk Grove, CA (US)

(73) Assignee: US Power, Inc., Fairfield, CA (US)

( * ) Notice: Subject to any disclaimer, the term of this patent is extended or adjusted under 35 U.S.C. 154(b) by 97 days.

(21) Appl. No.: 10/806,911

(22) Filed: Mar. 22, 2004

(51) Int. Cl.
    *G08B 21/00* (2006.01)
(52) U.S. Cl. .................. 340/636.13; 340/636.19; 324/433
(58) Field of Classification Search .......... 340/636.13, 340/636.19, 636.21, 636.2; 324/426, 433, 324/434; 320/116, 118; 307/66
See application file for complete search history.

(56) References Cited

U.S. PATENT DOCUMENTS

| | | | | |
|---|---|---|---|---|
| 4,441,066 A | * | 4/1984 | Burmenko | 320/165 |
| 5,047,961 A | * | 9/1991 | Simonsen | 702/63 |
| 5,744,932 A | * | 4/1998 | Kissel | 320/106 |
| 6,124,797 A | * | 9/2000 | Mercado | 340/636.15 |
| 2002/0138775 A1 | * | 9/2002 | Hammond et al. | 713/310 |

* cited by examiner

*Primary Examiner*—Daniel Wu
*Assistant Examiner*—Travis R. Hunnings (57) ABSTRACT

In an embodiment of the present invention, a clamp-on sensor is coupled at a single point of a battery string in an un-interruptible power supply. In embodiments of the present invention, the clamp-on sensor is a Hall effects sensor for sensing ripple current through the battery string. The clamp-on sensor is coupled with a logic circuit for detecting a battery failure of the battery string. In response to detecting a failure of the battery string, the logic circuit automatically generates a message over a communication network indicating the failure of a battery in the battery string. In embodiments of the present invention, the logic circuit can also generate a message indicating the failure of an inverter in the un-interruptible power supply.

29 Claims, 7 Drawing Sheets

SYSTEM FOR BATTERY ALARM NOTIFICATION AND A METHOD FOR IMPLEMENTING SAME

FIELD OF THE INVENTION

Embodiments of the present invention relate to redundant or un-interruptible power supplies and more specifically to monitoring the viability of a battery or group of batteries in an un-interruptible power supply.

BACKGROUND OF THE INVENTION

A data center is a central data processing facility and/or the group of people who manage the data processing and networks of a commercial or government entity. A data center may contain a network operations center (NOC), which is a restricted access area containing automated systems that constantly monitor server activity, Web traffic, and network performance and report even very slight irregularities to engineers so that they can spot potential problems before they happen. A data center may also house Web servers and/or provide data serving and other services for other companies.

An interruption in power to the data center (e.g., a blackout or brownout) may result in an interruption in services by the data center or a catastrophic data loss. To prevent this, many data centers and telephone networks use an un-interruptible power supply (UPS) to provide back-up power during power interruptions and/or to provide enough power to allow these systems to shut down in a known state. Typically, a component likely to fail in a UPS system is the battery or batteries which supply the back-up power. Because the batteries are coupled in series in a typical UPS system, the failure of one battery can cause the premature failure of the entire UPS when back-up power is required. Therefore, it is important to monitor the condition of the batteries to insure that the UPS is in condition to provide power during an emergency.

Figure 1A:
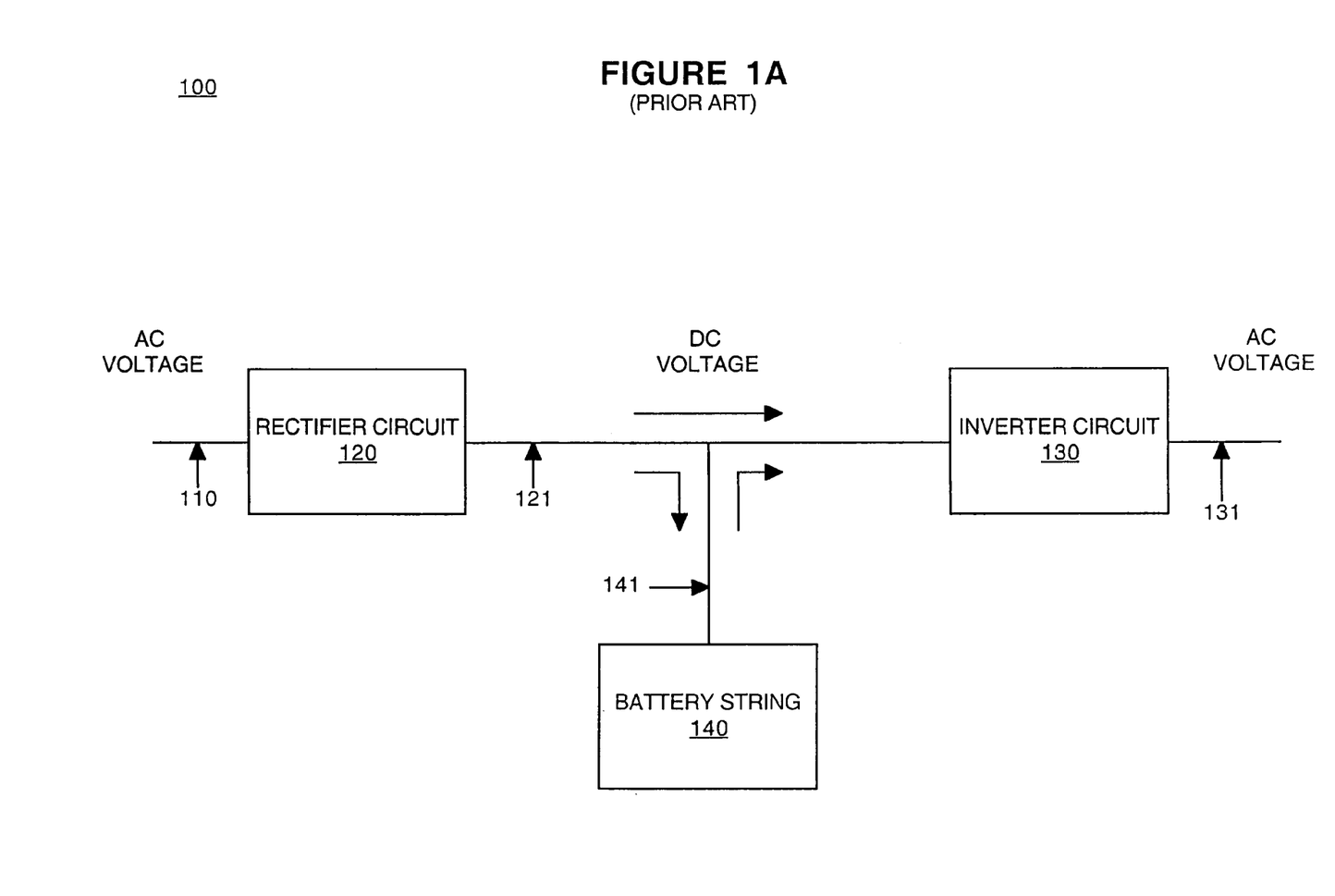
FIG. 1A is a diagram of an exemplary prior art uninterruptible power supply system.

FIG. 1A shows an exemplary prior art UPS system 100. Alternating current (AC) power is received via coupling 110 and is input to a rectifier circuit 120. Rectifier circuit 120 converts the AC power to a direct current (DC) or constant voltage which is output to coupling 121. Some of the DC voltage goes to inverter circuit 130 which converts the DC voltage to an AC voltage which is supplied to the data center via coupling 131. A portion of the DC voltage from rectifier circuit 120 is directed to battery string 140 via coupling 141 and recharges the batteries so that they are available to supply power as needed. During a power interruption, when power via coupling 110 is unavailable or reduced, the batteries in battery string 140 discharge and immediately supply power to inverter circuit 130 via coupling 141 where the DC voltage is converted to an AC voltage to supply power to the data center via coupling 131.

Figure 1B:
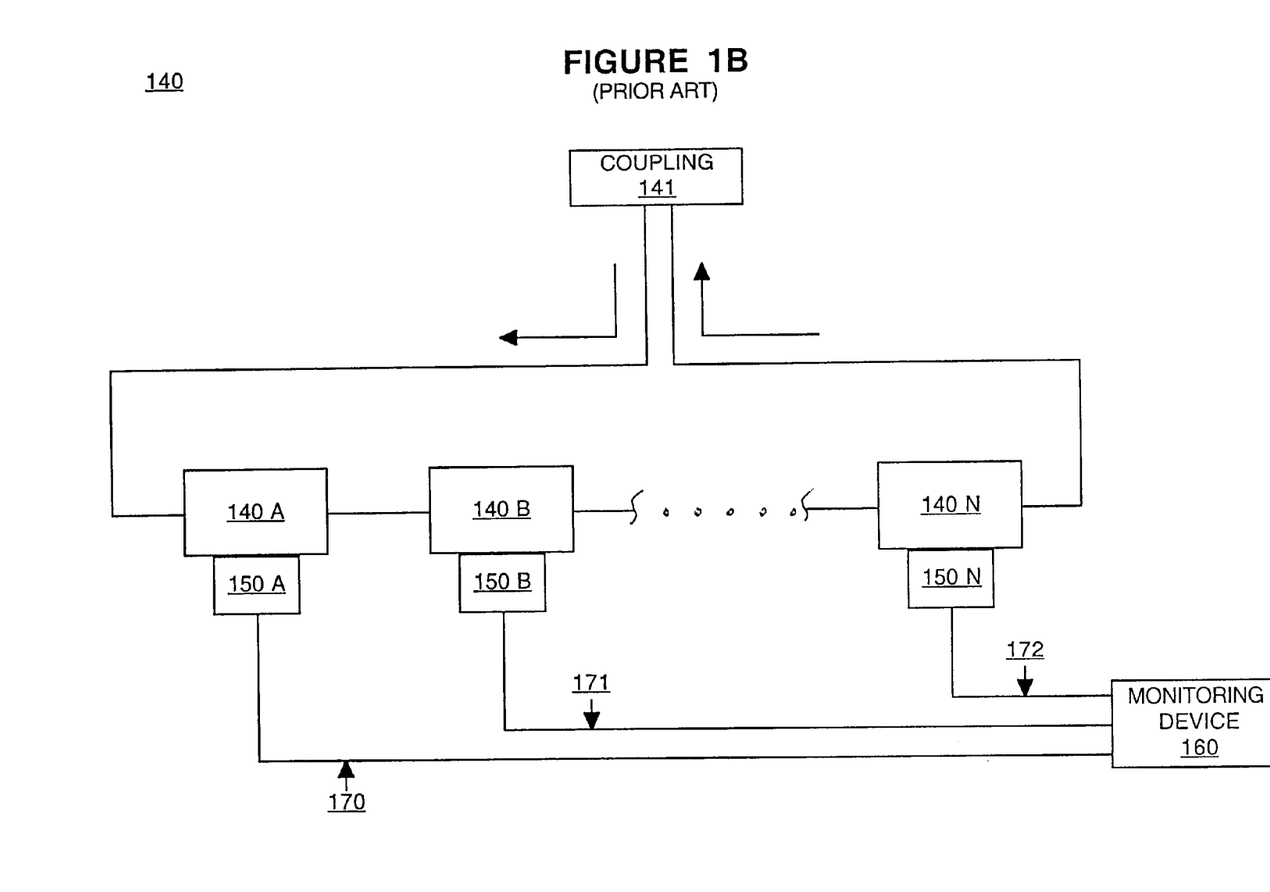
FIG. 1B is a diagram of an exemplary battery string used in a prior art uninterruptible power supply system.

FIG. 1B shows an exemplary battery string 140 used in a conventional UPS system. A typical battery string 140 comprises a plurality of batteries (e.g., batteries 140a, 140b, 140n) which are coupled in series. In a conventional UPS system, a battery string may comprise as many as 30–40 batteries. Additionally, a conventional UPS system may use a single battery string, or multiple strings (e.g., as many as 5 battery strings) in parallel to provide back-up power.

In one type of conventional battery monitoring system, a voltage monitor circuit (e.g., voltage monitors 150a, 150b, 150n of FIG. 1B) is respectively coupled with each battery in the UPS system and may also be coupled with a monitoring unit (e.g., monitoring unit 160 of FIG. 1B) via signal pathways 170, 171, and 172. The voltage monitor may be used to directly measure the impedance of its respective battery and, when the impedance exceeds a pre-determined level, generates an alarm signal to the monitoring unit.

This type of monitoring system is expensive to establish and maintain for many users because of the expense of the plurality of voltage monitor string 150 and the associated plurality of signal pathways needed to couple each voltage monitor with monitoring unit 160. Often, the cost of this type of monitoring system is as much as the battery string and UPS itself.

A less expensive monitoring system couples a current probe to the electrical coupling between the batteries in the battery string. The current probe monitors the current flux, also known as "ripple current" which is electrical noise generated at the rectifier circuit (e.g., rectifier circuit 120 of FIG. 1). A typical current probe comprises an AC current transformer having an iron core. During the cycle of an AC waveform, the iron core of the current probe becomes magnetized as the waveform approaches its peak. The iron core then becomes de-magnetized as the waveform approaches its trough. Unfortunately, during a power interruption, the iron core cannot de-magnetize and may begin to heat, which can cause a failure of the current probe. Thus, the current probes currently used may fail after a power interruption and therefore need to be replaced. This system also requires periodic maintenance wherein a technician checks the monitoring device 160 to determine if a battery failure has occurred. These periodic visits may be costly and unnecessary unless a battery failure has actually occurred.

Additionally, because of irregularities in the power supply (e.g., a temporary drop in the supply voltage) the batteries of the UPS may discharge to provide a constant supply of power. These occasional discharges of the battery string have a cumulative affect on the effective life of the current probe. Thus, over time the current probe approach can possibly fail to report a battery failure of the UPS. Additionally, these current probes are not coupled with a monitoring system. In other words, a technician is required to occasionally make a reading of the current probe to determine the status of the battery string.

SUMMARY OF THE INVENTION

Accordingly, a need exists for a battery monitoring system which provides constant monitoring of the power supply and does not necessitate an expensive and complicated infrastructure. What is further needed is a battery monitoring system that does not involve periodic manual checking of the batteries by technicians. What is further needed is a battery monitoring system that can be used in a UPS system that does not require a probe or monitoring device to be assigned to each battery. While meeting the above stated need, it is desirable that such a system will not be incapacitated by occasional discharge of the batteries in an un-interruptible power supply.

In an embodiment of the present invention, a clamp-on sensor is coupled at a single point of a battery string in an un-interruptible power supply for instance. In embodiments of the present invention, the clamp-on sensor may be a Hall effect sensor for electro-magnetically sensing ripple current through the battery string. The clamp-on sensor is coupled with a logic circuit for detecting a battery failure of the battery string. In one embodiment, failure is detected by measuring of the ripple current through the battery string. In response to detecting a failure of the battery string, the logic circuit automatically generates a message over a communication network indicating the failure of a battery in the battery string. In embodiments of the present invention, the logic circuit can also generate a message indicating the failure of an inverter in the un-interruptible power supply. In one embodiment, the message may be an electronic message, (e.g., e-mail) to a prescribed recipient.

Embodiments of the present invention are advantageous because they can be easily coupled with the un-interruptible power supply and do not require a complicated infrastructure. As a result, embodiments of the present invention are less expensive to install than conventional battery monitoring systems which constantly monitor battery viability at each battery in the string. Additionally, the clamp-on sensor of the present invention is less prone to damage during a discharge of the battery string which reduces the cost of maintaining the battery monitoring system. Additionally, the embodiments of the present invention generate failure messages only when one or more batteries of a battery string are failing. Therefore, the technician is only called to the site in response to an actual service need (e.g., to replace the malfunctioning battery). This is an improvement over the existing art which requires periodic service visits to manually check the viability of the batteries whether or not a failure exists.

These and other advantages of the present invention will become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

DETAILED DESCRIPTION OF THE PREFERRED EMBODIMENT

Reference will now be made in detail to the preferred embodiments of the present invention, examples of which are illustrated in the accompanying drawings. While the present invention will be described in conjunction with the preferred embodiments, it will be understood that they are not intended to limit the present invention to these embodiments. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 2:
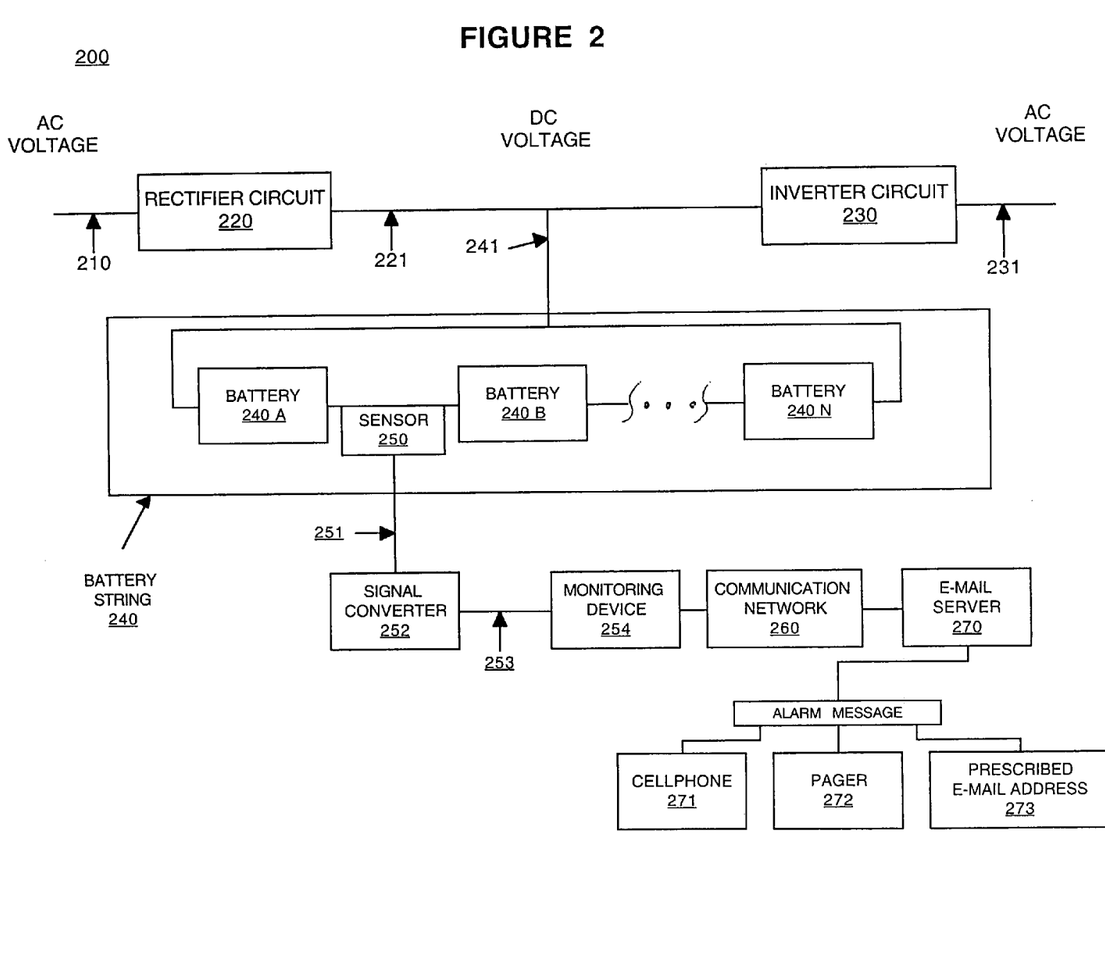
FIG. 2 is a diagram of an exemplary battery alarm notification system in accordance with embodiments of the present invention.

FIG. 2 is a diagram of an exemplary battery alarm notification system 200 in accordance with an embodiment of the present invention. In FIG. 2, alternating current (AC) power is received via coupling 210 and is input to a rectifier circuit 220. Rectifier circuit 220 converts the AC power to a constant (DC) voltage which is output to coupling 221. As described above with reference to FIGS. 1A and 1B, some of the DC voltage goes to inverter circuit 230 which converts the DC voltage back to AC power which is then supplied to the data center via coupling 231. The rest of the DC voltage from rectifier circuit 220 is directed to battery string 240 via coupling 241 and is used to recharge battery string 240 (e.g., batteries 240a, 240b, 240n).

In FIG. 2, a sensor 250 is coupled with series connected battery string 240. More specifically, sensor 250 may be a clamp-on sensor coupled at a single point of battery string 240. For example, sensor 250 can be clamped onto the wire coupling batteries 240A and 240B and detect electromagnetic emissions from that wire. Sensor 250 is a current sensor and a number of well known current sensing devices can be used in embodiments of the present invention.

In embodiments of the present invention, sensor 250 may comprise a Hall effect current transducer for detecting ripple current in battery string 240. In a typical UPS system, a low power sinusoidal noise signal, known as "ripple voltage," is generated by the rectifier circuit (e.g., rectifier circuit 220). Typically, this noise results from the 60 cycle power supply at 210. Because of the impedance of the batteries in battery string 240, the ripple voltage, due to Ohm's law, has an associated "ripple current" which can be detected by the current transducer of sensor 250. Thus, depending upon the ripple voltage from the inverter and the impedance of the batteries in the battery string, the ripple current in battery string 240 will vary. When one or more battery in battery string 240 begins to fail, its resistance typically increases which in turn decreases the overall ripple current detected by sensor 250.

Using a Hall effect sensor is advantageous over conventional UPS monitoring sensors because it is not as susceptible to damage when conducting a DC voltage because it electro-magnetically detects the ripple current through the battery string. Some conventional UPS monitoring systems utilize inductive sensors that can be damaged when power is interrupted and the batteries of the battery string discharge. A typical inductive sensor consists of a wire-wound core and a signal conditioner. A current is passed through a magnetically permeable core (e.g., an iron core) that magnifies the conductor's magnetic field.

Under normal operating conditions, AC current constantly changes potential from positive to negative and back again, and the expanding and collapsing magnetic field induces current in the windings that surround the core. However, when DC current is conducted through the core of the inductive sensor, the core becomes magnetized and frequently overheats, thus destroying the prior art sensor. Thus, in the event of a power interruption the batteries in the battery string will discharge and cause the inductive sensors to fail. As a result, the sensors used in some conventional UPS monitoring systems will have to be replaced. This can be expensive in systems which utilize many sensors.

However, using sensor 250 of the present invention, a power interruption will not damage the current sensor of the UPS monitoring system. As a result, down time for the UPS monitoring system is reduced using embodiments of the present invention. Additionally, replacing the sensors 250 is not necessitated as a result of a power interruption, thus reducing the cost of operating monitoring system 200. Because sensor 250 may be a clamp-on sensor, installation of battery alarm notification system 200 is simpler, and therefore, less expensive than conventional UPS monitoring systems.

Additionally, system 200 can be installed and maintained at a lower cost than conventional UPS monitoring systems. Because one sensor 250 is coupled with each battery string in the UPS system being monitored, the expense of coupling a sensor with each battery in the battery string, as well as a plurality of signal pathways to couple each sensor with a monitoring device, is not necessitated. As described above, one type of conventional UPS monitoring system couples a sensor with each battery in the battery string. This multiplies the expense of the monitoring system due to the cost of the multiple sensors used as well as the plurality of signal pathways which couple each of the sensors with a monitoring device. Additionally, maintaining this system is more complex and expensive than embodiments of the present invention. Furthermore, system 200 provides constant monitoring of the UPS system. As a result, a battery failure condition can be more quickly resolved than is possible with some conventional UPS monitoring systems which are not coupled with a communication network.

In embodiments of the present invention, sensor 250 is coupled with a signal converter 252 via coupling 251. Signal converter 252 comprises a signal conditioning circuit which converts the current signal output by sensor 250 to a voltage signal which is sent to a monitoring device 254. In one embodiment of the present invention, signal converter 252 receives a 2–10 milli-amp signal from sensor 250 and generates a 0–5 volt DC analog signal which is sent to monitoring device 254 via coupling 253. While the present embodiment shows signal converter 252 as a separate component, in embodiments of the present invention the functionality of signal converter 252 may be incorporated into sensor 250 or monitoring device 254.

In embodiments of the present invention, monitoring device 254 may be an EnviroCube monitoring system which is commercially available from TrendPoint Systems LLC of San Ramon, Calif. The EnviroCube is a monitoring system comprising a logic circuit and on-board memory and sensors for monitoring the temperature, and humidity of a room. The EnviroCube can also monitor hourly, daily, and monthly data trends of monitored events and can store prescribed thresholds which define acceptable performance parameters for battery string 240. The EnviroCube can also calculate statistically significant trend changes in monitored performance, even if the prescribed thresholds are not exceeded.

In response to detecting unacceptable performance parameters in battery string 240 (e.g., ripple current falling below an established threshold), monitoring device 254 can automatically generate a simple network monitoring protocol (SNMP) trap message to computer network 260 (e.g., via an Ethernet connection). In one embodiment of the present invention, network 260 is coupled with an electronic mail (e-mail) server 270 which automatically generates a message to, for example, cell phone 271 and/or pager 272 or a prescribed e-mail address 273 to notify a user of a failure condition in battery string 240.

Additionally, sensor 250 can be used to detect when the DC capacitors of rectifier circuit 220 are beginning to fail. This typically results in an increase in ripple current which can be detected by sensor 250. Thus, when the ripple current increases/decreases beyond prescribed parameters, monitoring device 254 automatically generates a failure message to network 260.

In embodiments of the present invention, the ripple current in battery string 240 may be monitored for a period of time to determine a base line ripple current level. The threshold settings (e.g., high threshold setting and low threshold setting) for initiating the sending of an alarm message can then be set. In one embodiment, monitoring device 254 automatically determines the base line ripple current in battery string 240 and then automatically utilizes pre-set parameters to determine when to send an alarm message. Because each battery string typically exhibits different ripple current characteristics, it is important to determine the base line ripple current of each battery string individually. Once the base line ripple current has been determined, monitoring device 254 can then establish threshold settings which will trigger automatically sending a failure message.

For example, monitoring device 254 may monitor the ripple current of battery string 240 for a period of time and determine that battery string 240 has a base line ripple current of 3 milli-amps. Thus, monitoring device 254 may automatically use a reading of 3 milli-amps as the base line ripple current measurement for battery string 240. Monitoring device 254 can then use pre-set parameters wherein an increase or decrease in the ripple current of more than 1 milli-amp (e.g., 2 milli-amps or 4 milli-amps) will automatically initiate sending an alarm message to network 260. Alternatively, a user can override the pre-set parameters so that, for example, an increase or decrease of the base line ripple current greater than 0.7 milli-amps (e.g., 2.3 milli-amps or 3.7 milli-amps) will automatically initiate sending an alarm message to network 260.

Figure 3:
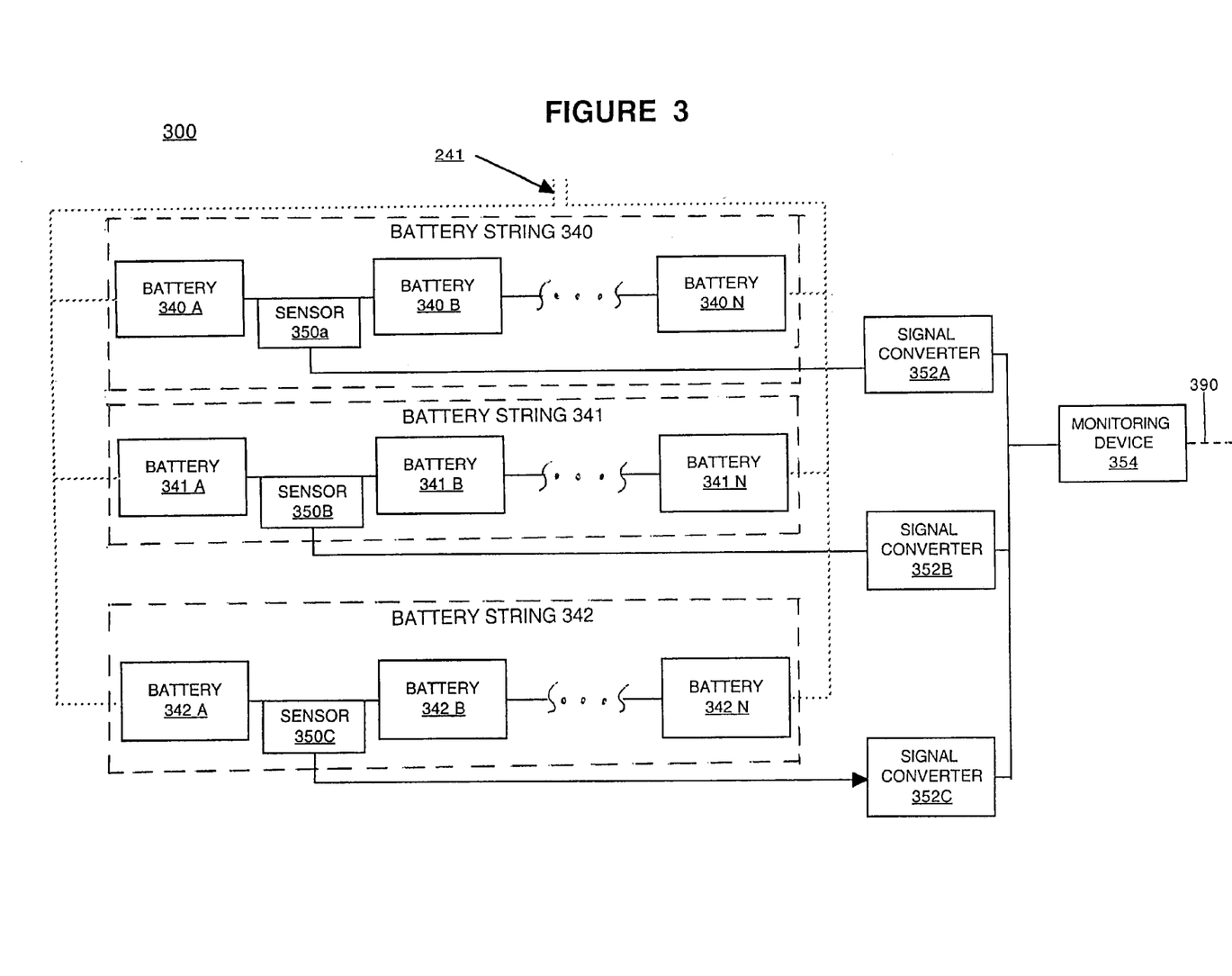
FIG. 3 is a diagram of an exemplary battery alarm notification system for monitoring a plurality of battery strings in accordance with another embodiment of the present invention.

FIG. 3 is a diagram of an exemplary battery alarm notification system 300 in accordance with embodiments of the present invention. In FIG. 3, a plurality of battery strings (e.g., battery strings 340, 341, and 342) are coupled in parallel. Each of the battery strings is coupled with a sensor (e.g., sensors 350a, 350b, and 350c respectively) as described above with reference to sensor 250 of FIG. 2. Thus, in the embodiment of FIG. 3, each battery string is coupled with its own ripple current sensor. Each of the sensors is coupled with a signal converter (e.g., signal converters 352a, 352b, and 352c respectively) which is utilized as described above with reference to signal converter 252 of FIG. 2. Finally, each of the signal converters is coupled with monitoring device 354, which is coupled with a communication network (e.g., communication network 260 of FIG. 2) via coupling 390, and is utilized as described above with reference to monitoring device 254 of FIG. 2.

As described above, embodiments of the present invention are advantageous over conventional UPS monitoring systems because fewer sensors are needed to monitor the battery strings. With reference to FIG. 1B, each battery in battery string 140 is coupled with its respective voltage monitor. If such a UPS monitoring system were used in system 300, at least 3N voltage monitors would be required. Additionally, at least 3N signal pathways would be required to communicatively couple the voltage monitors with monitoring device 354. As described above, the expense of installing and maintaining this type of monitoring system is too expensive for many users of UPS systems.

Figure 4:
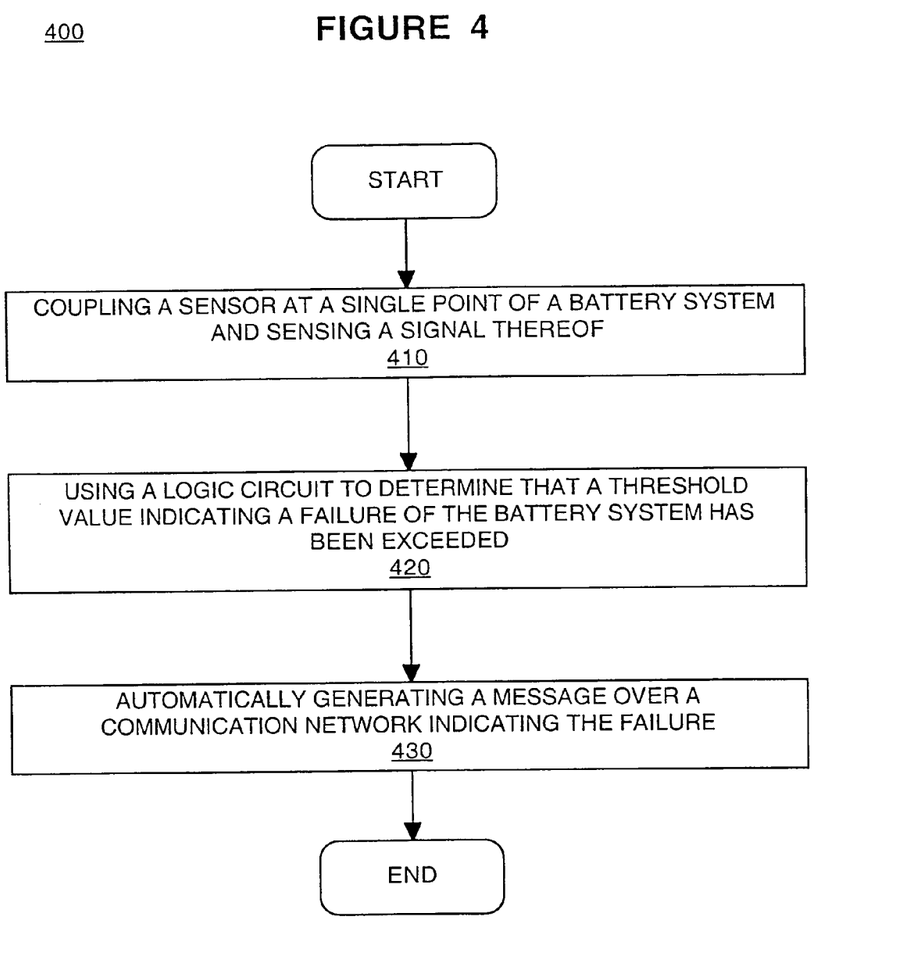
FIG. 4 is a flowchart of a method for monitoring a battery system in accordance with embodiments of the present invention.

FIG. 4 is a flow chart of a method 400 for implementing a battery alarm notification system in accordance with embodiments of the present invention. In step 410 of FIG. 4, a sensor is coupled at a single point (per battery string) of a battery system for sensing a signal of the battery system. As described above with reference to FIG. 2, in embodiments of the present invention, sensor 250 may be a clamp-on sensor which is coupled with battery string 240 at a single point. This is advantageous over some conventional UPS monitoring systems because the cost of installing and maintaining the monitoring system is reduced. In embodiments of the present invention, a sensor is respectively coupled with each of a plurality of battery strings in a UPS circuit.

In step 420 of FIG. 4, a logic circuit determines that a threshold value indicating a failure of the battery system has been exceeded. As described above with reference to FIG. 2, monitoring device 254 comprises a logic circuit which compares the signal received from signal converter 252 with a pre-set threshold value. The pre-set value defines a threshold value which, if exceeded, indicates a failure condition for the battery string.

In step 430 of FIG. 4, in response to step 420, a message is automatically generated over a communication network indicating the failure of the battery system. As described above with reference to FIG. 2, monitoring device 254 automatically generates a message to e-mail server 270 via network 260 when a failure condition has been detected. E-mail server 270 can then generate a message to a prescribed recipient (e.g., to cellphone 271 or pager 272) informing the recipient of the battery string failure. Upon detecting a failure, the message is sent, for example, to a technician who then visits the UPS site and checks the batteries in battery string 240 to determine which battery is failing. The technician then replaces the failing battery or batteries in battery string 240.

Figure 5:
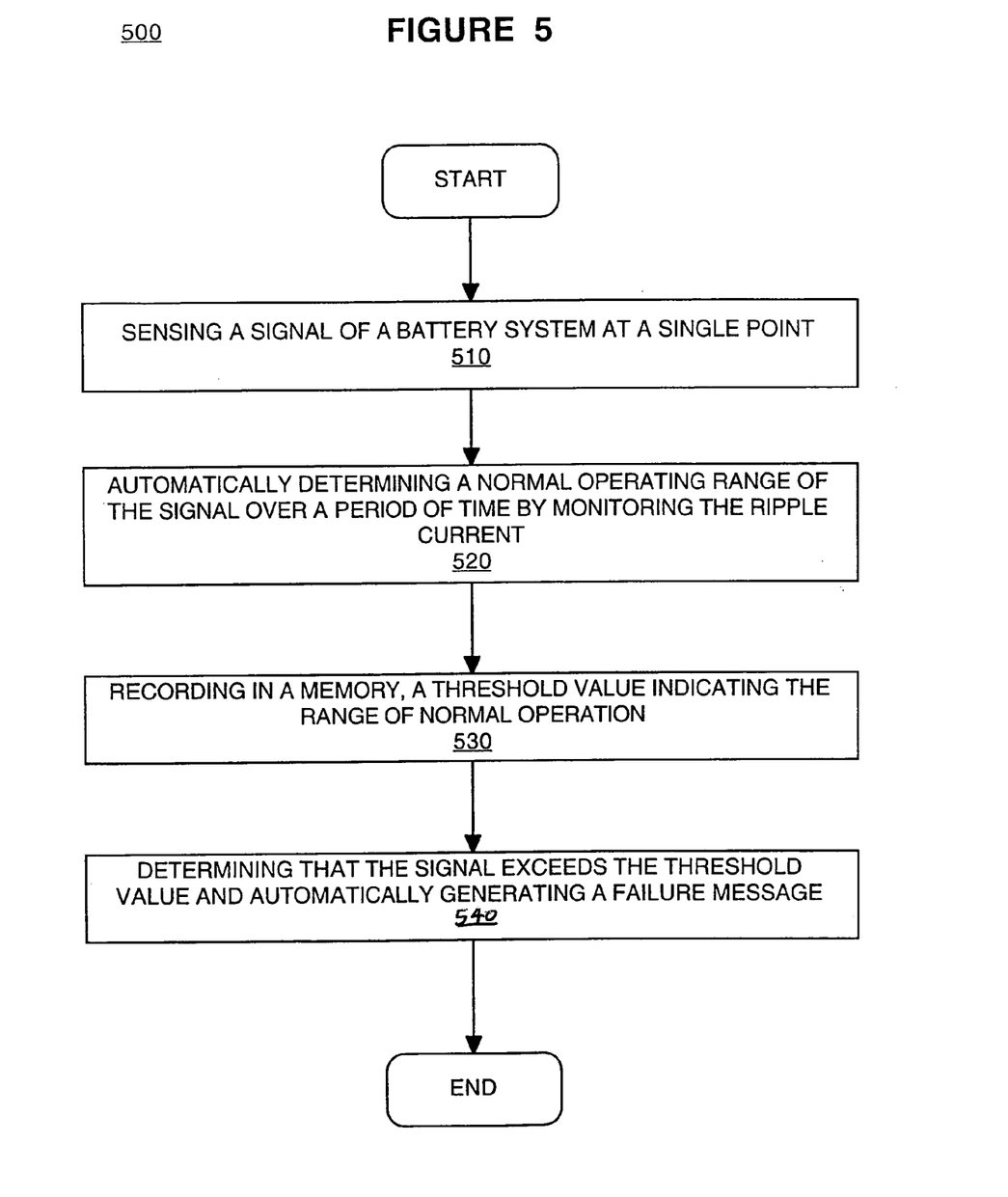
FIG. 5 is a flowchart of a method for monitoring a battery system in accordance with embodiments of the present invention.

FIG. 5 is a flow chart of a method 500 for monitoring a battery system in accordance with embodiments of the present invention where the normal operational range of the ripple current is automatically determined. In step 510 of FIG. 5, a signal of a battery system is sensed at a single point. As discussed above with reference to FIG. 2, in embodiments of the present invention, sensor 250 may be electro-magnetically coupled with battery string 240 at a single point. Additionally, sensor 250 may be used to sense and monitor the ripple current in battery string 240.

In step 520 of FIG. 5, a normal operating range of the signal is automatically determined by monitoring the ripple current over a period of time (e.g., a week or less). As discussed above with reference to FIG. 2, in embodiments of the present invention, the ripple current in battery string 240 may be monitored for a period of time to determine a base line ripple current level for battery string 240.

In step 530 of FIG. 5, a threshold value indicating the normal operating range of the battery system is recorded in a memory. A measured value outside the range may indicate a failure of the battery system. As discussed above with reference to FIG. 2, sensor 250 is communicatively coupled with monitoring device 254. In embodiments of the present invention, monitoring device 254 comprises a memory (not shown) for storing instructions and digital data. In embodiments of the present invention, the memory may store threshold values which, if exceeded, will trigger sending a failure message of the battery system. In embodiments of the present invention, the threshold values may indicate that a battery in battery string 240 is failing or has failed, or that DC capacitors in rectifier circuit 220 have failed.

In step 540 of FIG. 5, a determination is made that the signal exceeds the threshold value and a failure message is automatically generated over a communication network in response to the determination. In embodiments of the present invention, in response to the determining that the ripple current sensed by sensor 250 has exceeded the threshold value stored in the memory of monitoring device 254, a message is generated by monitoring device 254 for notifying a specified recipient of the failure of the battery system.

Figure 6:
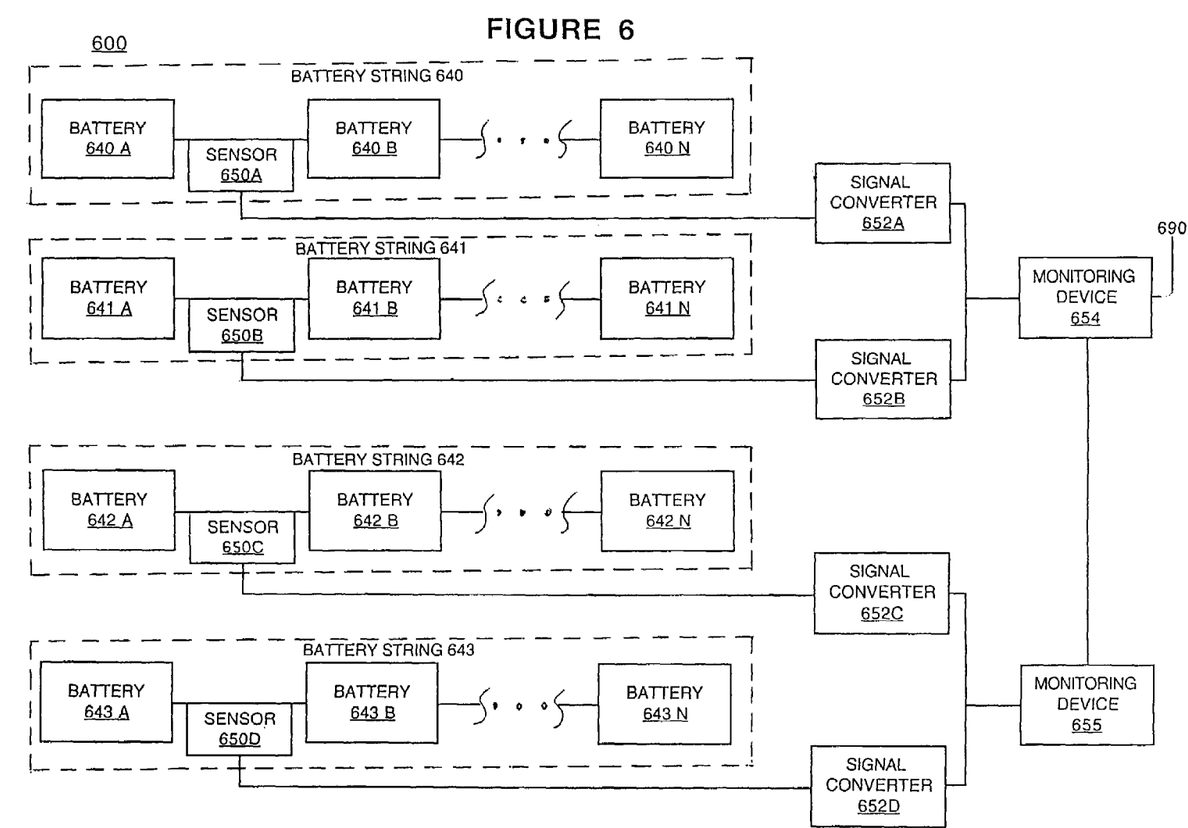
FIG. 6 shows a battery alarm notification system comprising a plurality of monitoring devices in accordance with embodiments of the present invention.

FIG. 6 shows a battery alarm notification system 600 comprising a plurality of monitoring devices in accordance with embodiments of the present invention. In the embodiment of FIG. 6, battery string 640, 641, 642, and 643 are electro-magnetically coupled with sensors 650A, 650B, 650C, and 650D respectively and monitor the respective ripple current thereof. Sensors 650A and 650B are communicatively coupled with signal converters 652A and 652B respectively. Signal converters 652A and 652B are also communicatively coupled with monitoring device 654. Sensors 650C and 650D are communicatively coupled with signal converters 652C and 652D respectively. Signal converters 652C and 652D are also communicatively coupled with a monitoring device 655. Furthermore, monitoring device 655 is communicatively coupled with monitoring device 654. In embodiments of the present invention, a plurality of monitoring devices can be communicatively coupled to allow monitoring of a plurality of battery strings. As described above with reference to FIG. 2, in embodiments of the present invention, monitoring device 654 and monitoring device 655 may be an EnviroCube monitoring system which is commercially available from TrendPoint Systems LLC of San Ramon, Calif.

In embodiments of the present invention, the output from one monitoring device (e.g., monitoring device 655) may be an input to another monitoring device (e.g., monitoring device 654). When, for example, monitoring device 655 determines that the ripple current sensed by sensor 650D has exceeded a prescribed parameter, it can generate an alarm message or some other indication to monitoring device 654. Monitoring device 654 can then automatically initiate generating a message indicating a failure condition of battery string 643 via coupling 690 as described above with reference to FIG. 2. Alternatively, monitoring device 655 may automatically initiate generating a message indicating a failure condition of battery string 643 which is sent to a communication network (e.g., 260 of FIG. 2) via monitoring device 654.

In one embodiment of the present invention, additional monitoring devices may be communicatively coupled directly with monitoring device 654. In another embodiment, additional monitoring devices may be communicatively coupled with monitoring device 655 (e.g., a series or "daisy chain" of monitoring devices) which is then communicatively coupled with monitoring device 654.

The preferred embodiment of the present invention, a system for battery alarm notification, is thus described. While the present invention has been described in particular embodiments, it should be appreciated that the present invention should not be construed as limited by such embodiments, but rather construed according to the following claims.

What is claimed is:

1. An electronic system comprising:
   a magnetic sensor for coupling to a battery string at a single point, wherein said magnetic sensor is connected between at least two batteries within said battery string, for sensing a signal thereof; and
   a logic circuit coupled to said magnetic sensor and for automatically establishing threshold settings for detecting a battery failure of said battery string and, in response thereto, said circuit for automatically generating a message over a communication network wherein said message initiates generation of an electronic message (email) to a prescribed recipient and wherein said email indicates and describes said battery failure of said battery string and wherein said message initiates a call to said prescribed recipient at a remote location notifying said prescribed recipient of said battery failure of said battery string.

2. An electronic system as described in claim 1 wherein said magnetic sensor senses current of said battery string and further comprising a signal conditioning circuit coupled between said magnetic sensor and said logic circuit, said signal conditioning circuit for converting a current signal output from said sensor to a voltage signal supplied to said logic circuit.

3. An electronic system as described in claim 2 wherein said current of said battery string is a ripple current through said battery string at said single point.

4. An electronic system as described in claim 1 wherein said magnetic sensor is a Hall effect clamp-on sensor electro-magnetically coupled to said battery string.

5. An electronic system as described in claim 4 wherein said magnetic sensor senses ripple current through said battery string.

6. An electronic system as described in claim 5 wherein said logic circuit detects said battery failure in response to said magnetic sensor detecting a ripple current through said battery string dropping below a prescribed threshold.

7. An electronic system as described in claim 1 wherein said logic circuit detects said battery failure in response to said magnetic sensor detecting an electrical signal of said battery string dropping below a prescribed threshold.

8. An electronic system as described in claim 1 wherein said battery string is part of an un-interruptible power supply (UPS) circuit and wherein further said logic circuit is also for detecting failure in a rectifier of said UPS circuit.

9. An electronic system as described in claim 8 wherein said logic circuit detects said rectifier failure in response to said magnetic sensor detecting an electrical signal of said battery string raising above a prescribed threshold.

10. A method for monitoring a battery system comprising:
    using a magnetic sensor coupled at a single point of said battery systems wherein said magnetic sensor is connected between at least two batteries within said battery system, to sense a signal thereof;
    automatically establishing threshold setting for detecting a battery failure of said battery system;
    determining that a threshold setting value indicating a failure of said battery system has been exceeded according to said signal; and
    automatically generating a message over a communication network indicating and describing the failure of said battery system in response to said determining wherein said message initiates generation of an electronic message (email) to a prescribed recipient and wherein said email indicates and describes said battery failure of said battery system and wherein said message initiates a call to said prescribed recipient at a remote location notifying said prescribed recipient of said battery failure of said battery system.

11. The method as recited in claim 10 wherein said magnetic sensor senses a ripple current of said battery system and further comprising:
    converting said ripple current to a voltage signal for use in said determining.

12. The method as recited in claim 10 wherein said magnetic sensor comprises a Hall effect sensor electromagnetically coupled with said battery system and further comprising: using said Hall effect magnetic sensor to sense a ripple current of said battery system.

13. The method as recited in claim 12 wherein said determining determines that said ripple current has dropped below a prescribed threshold.

14. The method as recited in claim 10 wherein said battery system is part of an un-interruptible power supply (UPS) circuit and further comprising:
    detecting rectifier failure in said UPS circuit, wherein said logic circuit determines that said signal has exceeded a prescribed threshold.

15. A battery alarm notification system comprising:
    a battery string comprising a plurality of batteries coupled in series;
    a magnetic sensor coupled at a single point of said battery string, wherein said magnetic sensor is connected between at least two batteries within said battery string, for sensing a ripple current thereof; and
    a logic circuit coupled with said magnetic sensor for automatically establishing threshold settings for detecting a battery failure and for determining that said ripple current has dropped below a prescribed threshold and for automatically generating a message over a communication network in response to said determining wherein said message initiates generation of an electronic message (email) to a prescribed recipient and wherein said email indicates and describes said battery failure of said battery string and wherein said message initiates a call to said prescribed recipient at a remote location notifying said prescribed recipient of said battery failure of said battery string.

16. The battery alarm notification system of claim 15, wherein said magnetic sensor is a Hall effect sensor and further is a clamp-on sensor which is electro-magnetically coupled with said battery string.

17. The battery alarm notification system of claim 15 wherein said battery string is part of an un-interruptible power system (USP) circuit comprising a rectifier circuit and wherein said logic circuit is further for automatically generating a message in response to detecting a failure of said rectifier circuit of said UPS system.

18. The battery alarm notification system of claim 17 wherein said logic circuit determines that said ripple current has raised above a prescribed threshold.

19. The battery alarm notification system of claim 15 further comprising:
    a signal converter for converting said ripple current to a voltage signal.

20. A method for monitoring a battery system comprising:
    automatically establishing threshold settings for detecting a battery failure;
    detecting a battery failure or one or more batteries of a battery string by measuring a variation in ripple current therethrough at a single point of said battery string, wherein said measurement is performed between at least two batteries within said battery string; and automatically generating a message for reporting said battery failure detection via a communication network indicating and describing the failure of said battery string wherein said message initiates generation of an electronic message (email) to a prescribed recipient and wherein said email indicates and describes said battery failure of said battery string and wherein said message initiates a call to said prescribed recipient at a remote location notifying said prescribed recipient of said battery failure of said battery string.

21. The method as recited in claim 20 wherein said measuring is performed using a electro-magnetically coupled sensor at a single point of said battery string.

22. The method as recited in claim 21 wherein said sensor comprises a Hall effect sensor.

23. The method as recited in claim 20 wherein said detecting comprises determining that said ripple current has dropped below a prescribed threshold.

24. The method as recited in claim 20 wherein said battery system is part of an un-interruptible power system (UPS) circuit comprising a rectifier circuit and further comprising:
   determining that said ripple current has exceeded a prescribed threshold.

25. A method for monitoring a battery system comprising:
   sensing at a single point of said battery system a signal thereof, wherein said single point is connected between at least two batteries within said battery system;
   automatically determining a normal operating range of said signal over a period of time;
   recording in a memory a threshold value indicative of said normal operating range; and
   determining that said signal exceeds said threshold value and automatically generating a failure message over a communication network indicating and describing the failure of said battery string in response thereto and wherein said message initiates generation of an electronic message (email) to a prescribed recipient and wherein said email indicates and describes said battery failure of said battery system and wherein said message initiates a call to said prescribed recipient at a remote location notifying said prescribed recipient of said battery failure of said battery system.

26. The method as recited in claim 25 wherein said signal comprises a ripple current and wherein said sensing uses an electro-magnetically coupled sensor to sense said ripple current.

27. The method as recited in claim 26 wherein said sensor comprises a Hall effect sensor.

28. The method as recited in claim 26 wherein said Hall effect sensor determines that said ripple current has dropped below said threshold value.

29. The method as recited in claim 26 wherein said battery system is part of an un-interruptible power supply (UPS) circuit comprising a rectifier circuit and further comprising:
   determining that said ripple current has exceeded said threshold value.

* * * * *